United States Patent
Inoue et al.

(10) Patent No.: US 12,532,612 B2
(45) Date of Patent: Jan. 20, 2026

(54) DISPLAY DEVICE WITH OVERLAPPING CONTACT HOLES EXPOSING EDGE OF AN INSULATOR AND METHOD FOR MANUFACTURING SAME

(71) Applicant: SHARP KABUSHIKI KAISHA, Sakai (JP)

(72) Inventors: Satoshi Inoue, Sakai (JP); Hirohiko Nishiki, Sakai (JP); Teruyuki Nakanishi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 748 days.

(21) Appl. No.: 17/802,089

(22) PCT Filed: Feb. 26, 2020

(86) PCT No.: PCT/JP2020/007765
§ 371 (c)(1),
(2) Date: Aug. 24, 2022

(87) PCT Pub. No.: WO2021/171422
PCT Pub. Date: Sep. 2, 2021

(65) Prior Publication Data
US 2023/0082475 A1   Mar. 16, 2023

(51) Int. Cl.
*H10K 59/123* (2023.01)
*H10K 59/124* (2023.01)
(Continued)

(52) U.S. Cl.
CPC ......... *H10K 59/123* (2023.02); *H10K 59/124* (2023.02); *H10K 50/17* (2023.02);
(Continued)

(58) Field of Classification Search
CPC .............. H10K 59/123; H10K 59/124; H10K 59/1201; H10K 59/8731; H10K 71/00; H10K 50/844; H10K 50/17; H10K 50/171
See application file for complete search history.

(56) References Cited

U.S. PATENT DOCUMENTS

2004/0257787 A1   12/2004   Taguchi et al.
2014/0252365 A1    9/2014   Shinokawa et al.
(Continued)

FOREIGN PATENT DOCUMENTS

JP   2004333642 A   11/2004
JP   2009076544 A    4/2009
(Continued)

*Primary Examiner* — Lex H Malsawma
(74) *Attorney, Agent, or Firm* — ScienBiziP, P.C.

(57) ABSTRACT

A display device includes: a base substrate; a thin-film transistor layer provided on the base substrate and having a stack of, in sequence, a lower wire, a flattening film composed of an organic insulating film, an interlayer insulating film composed of an inorganic insulating film, and an upper wire; and a light-emitting element layer, wherein the flattening film has a first contact hole formed to pass through the flattening film and formed for electrically connecting the lower wire and the upper wire together, the interlayer insulating film has a second contact hole formed to pass through the interlayer insulating film and formed for electrically connecting the lower wire and the upper wire together, and at least a part at an edge of the flattening film provided with the first contact hole is exposed from an edge of the interlayer insulating film provided with the second contact hole.

19 Claims, 13 Drawing Sheets

(51) Int. Cl.
*H10K 50/17* (2023.01)
*H10K 59/12* (2023.01)
*H10K 59/80* (2023.01)

(52) U.S. Cl.
CPC ....... *H10K 50/171* (2023.02); *H10K 59/1201* (2023.02); *H10K 59/8731* (2023.02)

(56) References Cited

U.S. PATENT DOCUMENTS

2015/0108467 A1\* 4/2015 Moriguchi ......... H10D 30/6704
257/43
2017/0179162 A1 6/2017 Moriguchi et al.
2018/0145125 A1\* 5/2018 Lee .................... H10K 77/111
2019/0165298 A1 5/2019 Lee et al.
2019/0198674 A1 6/2019 Ozeki et al.
2021/0091339 A1 3/2021 Kishimoto et al.

FOREIGN PATENT DOCUMENTS

| JP | 2014003208 A | 1/2014 |
| JP | 2016219362 A | 12/2016 |
| JP | 2019102446 A | 6/2019 |
| JP | 2019117892 A | 7/2019 |
| JP | 2019204967 A | 11/2019 |
| JP | 6648349 B1 | 2/2020 |
| WO | 2012/086513 A1 | 6/2012 |
| WO | 2013/108326 A1 | 7/2013 |

\* cited by examiner

DISPLAY DEVICE WITH OVERLAPPING CONTACT HOLES EXPOSING EDGE OF AN INSULATOR AND METHOD FOR MANUFACTURING SAME

TECHNICAL FIELD

The disclosure relates to a display device and a method for manufacturing the same.

BACKGROUND ART

Attention has been recently drawn to self-emission organic EL displays including organic electroluminescence (hereinafter, referred also to as EL) elements, as display devices instead of liquid crystal displays. These organic EL displays include the following for instance: a base substrate, such as a resin substrate; a thin-film transistor (hereinafter referred also to as TFT) layer provided on the base substrate; an organic EL element layer provided on the TFT layer; and a sealing film provided to cover the organic EL element layer. Here, the TFT layer includes, for instance, a base coat film provided on the base substrate, a plurality of TFTs provided on the base coat film, and a flattening film provided to cover individual TFTs. Further, the organic EL element layer includes, for instance, a plurality of first electrodes provided on the flattening film of the TFT layer, a plurality of organic EL layers provided on the plurality of respective first electrodes, and a second electrode provided to cover the individual organic EL layers.

For instance, Patent Literature 1 discloses an organic EL element formed in a flattening film, covering TFTs to flatten the surface, and specifying the aspect ratio of a contact hole, which brings a lower electrode (first electrode) and a TFT into electrical contact.

CITATION LIST

Patent Literature

Patent Literature 1: Japanese Unexamined Patent Application Publication No. 2009-76544

SUMMARY

Technical Problem

By the way, the pixel density in high-definition organic EL displays has been increasingly enhanced; thus, in the endeavor of, for instance, establishing an electrical connection between its lower wire, which is below a contact hole, and its upper wire, which is over the contact hole, via the contact hole formed in the flattening film, such an electrical connection between the lower wire and the upper wire is difficult to achieve due to faulty electrical continuity in the contact hole.

The disclosure has been made in view of this problem and aims to prevent faulty electrical continuity in a contact hole.

Solution to Problem

To achieve the above object, a display device according to the disclosure includes the following: a base substrate; a thin-film transistor layer provided on the base substrate and having a stack of, in sequence, a lower wire, a flattening film composed of an organic insulating film, an interlayer insulating film composed of an inorganic insulating film, and an upper wire; and a light-emitting element layer provided on the thin-film transistor layer and including a plurality of first electrodes, a plurality of light-emitting layers, and a common second electrode stacked sequentially in correspondence with a plurality of sub-pixels constituting a display region, wherein the flattening film has a first contact hole formed to pass through the flattening film and formed for electrically connecting the lower wire and the upper wire together, the interlayer insulating film has a second contact hole formed to pass through the interlayer insulating film and formed for electrically connecting the lower wire and the upper wire together, and at least a part of the edge of the flattening film provided with the first contact hole is exposed from the edge of the interlayer insulating film provided with the second contact hole.

Further, a method for manufacturing a display device according to the disclosure, includes the following: a thin-film transistor layer forming step of forming, onto a base substrate, a thin-film transistor layer having a stack of, in sequence, a lower wire, a flattening film composed of an organic insulating film, an interlayer insulating film composed of an inorganic insulating film, and an upper wire; and a light-emitting element layer forming step of forming, onto the thin-film transistor layer, a light-emitting element layer including a plurality of first electrodes, a plurality of light-emitting layers, and a common second electrode stacked sequentially in correspondence with a plurality of sub-pixels that constitute a display region, wherein the thin-film transistor layer forming step includes the following: a flattening film forming step of forming the flattening film having a first contact hole that is formed so as to pass through the flattening film and is formed for electrically connecting the lower wire and the upper wire together; and an interlayer insulating film forming step of forming the interlayer insulating film having a second contact hole that is formed so as to pass through the interlayer insulating film and is formed for electrically connecting the lower wire and the upper wire together, and wherein the interlayer insulating film forming step includes forming the second contact hole so as to expose at least a part of the edge of the flattening film provided with the first contact hole.

Advantageous Effect of Disclosure

In the disclosure, at least a part of the edge of the flattening film provided with the first contact hole is exposed from the edge of the interlayer insulating film provided with the second contact hole; accordingly, this can prevent faulty electrical continuity in the contact holes.

FIG. S is a plan view of a first contact hole and a second contact hole respectively formed in a flattening film and an interlayer insulating film both constituting the TFT layer of the organic EL display, as well as a plan view of their vicinity, according to the first embodiment of the disclosure.

Figure 5:
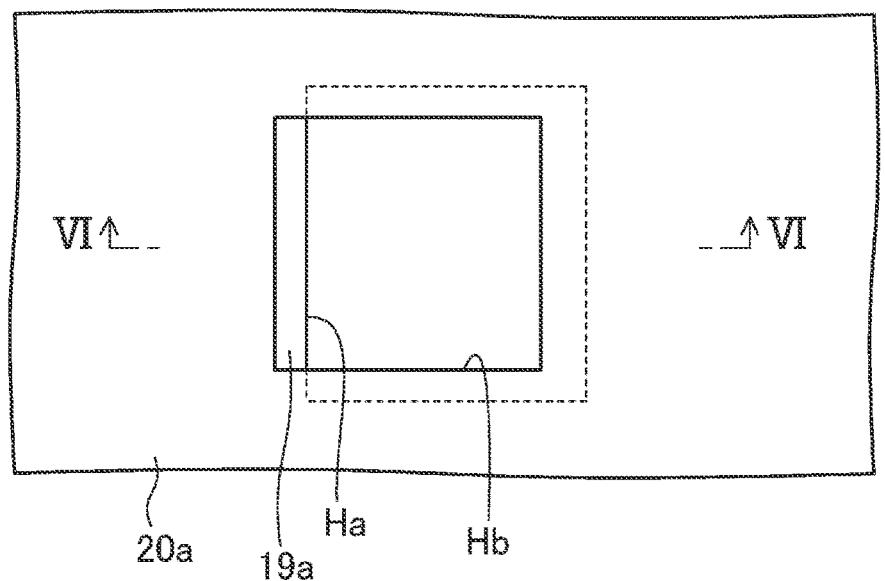
Figure 6:
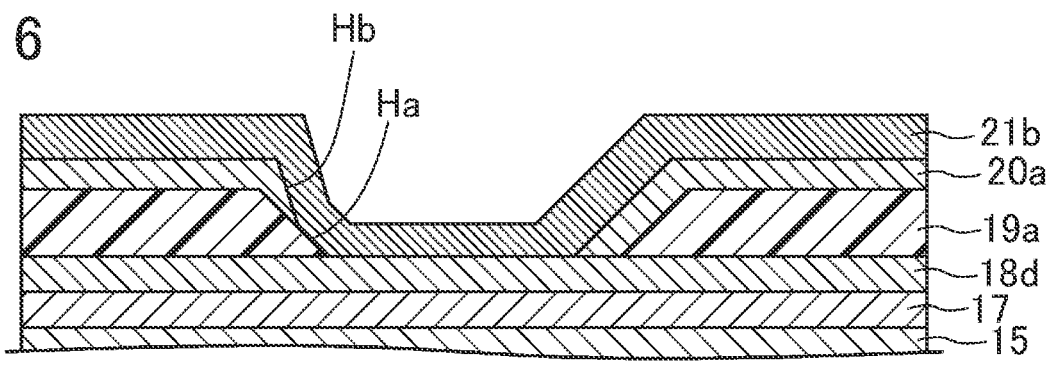

FIG. 6 is a sectional view taken along line VI-VI in FIG. 5.

Figure 7:
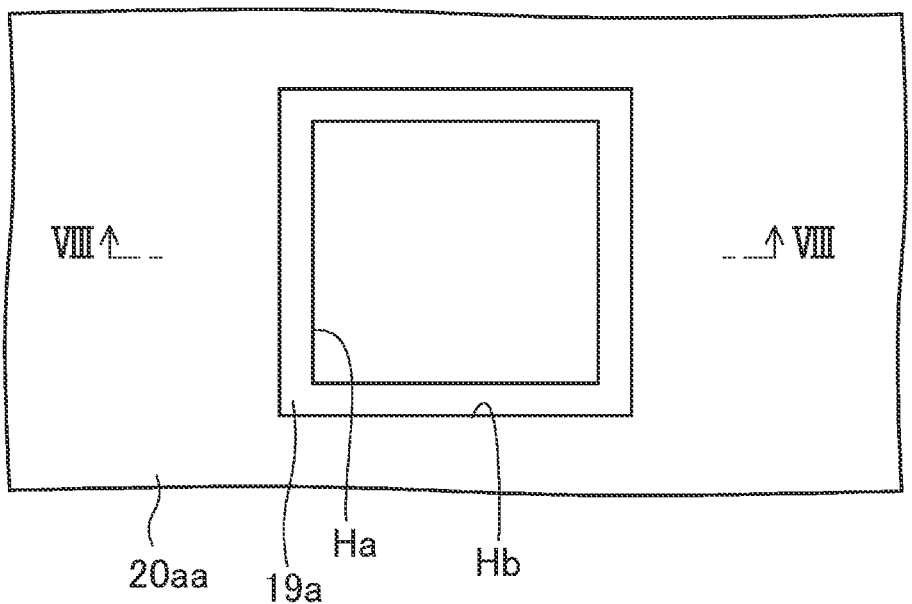

FIG. 7 is a plan view of a first modification of the organic EL display according to the first embodiment of the disclosure and corresponds to FIG. 5.

Figure 8:
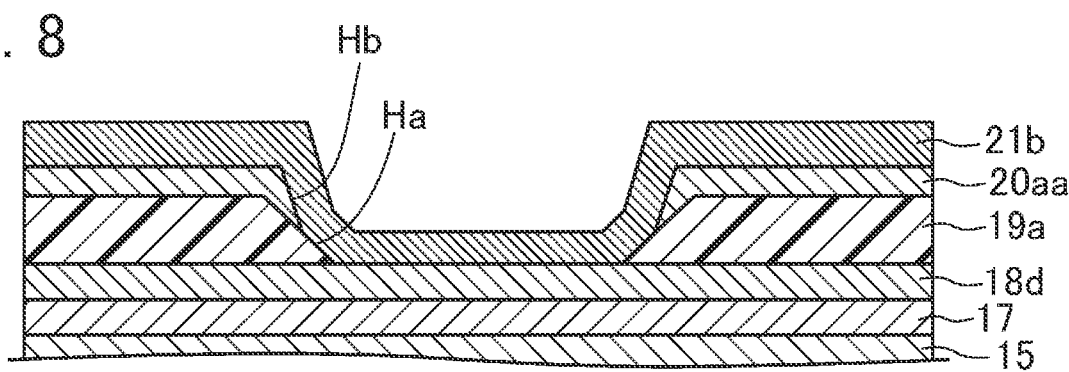

FIG. 8 is a sectional view taken along line VIII-VIII in FIG. 7.

Figure 9:
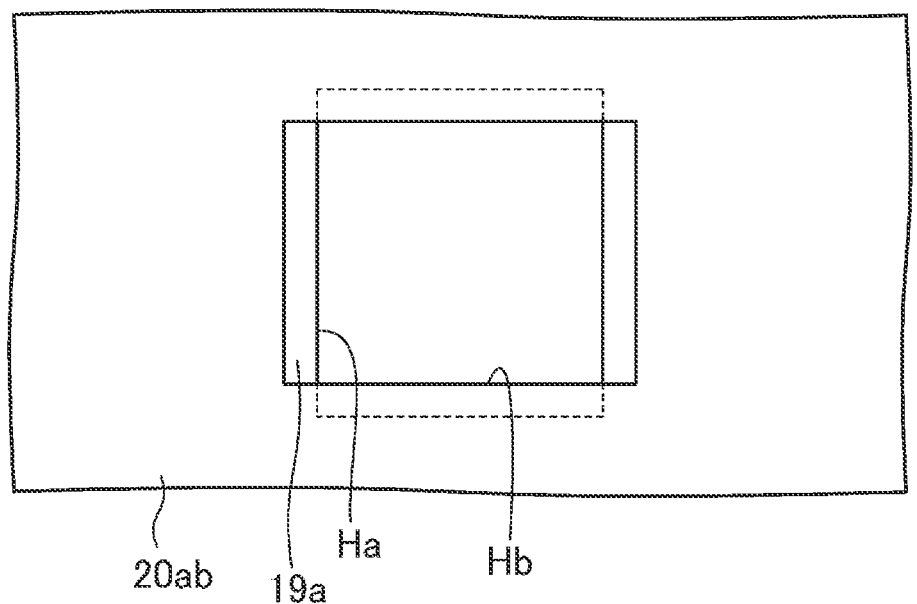

FIG. 9 is a plan view of a second modification of the organic EL display according to the first embodiment of the disclosure and corresponds to FIG. 5.

Figure 10:
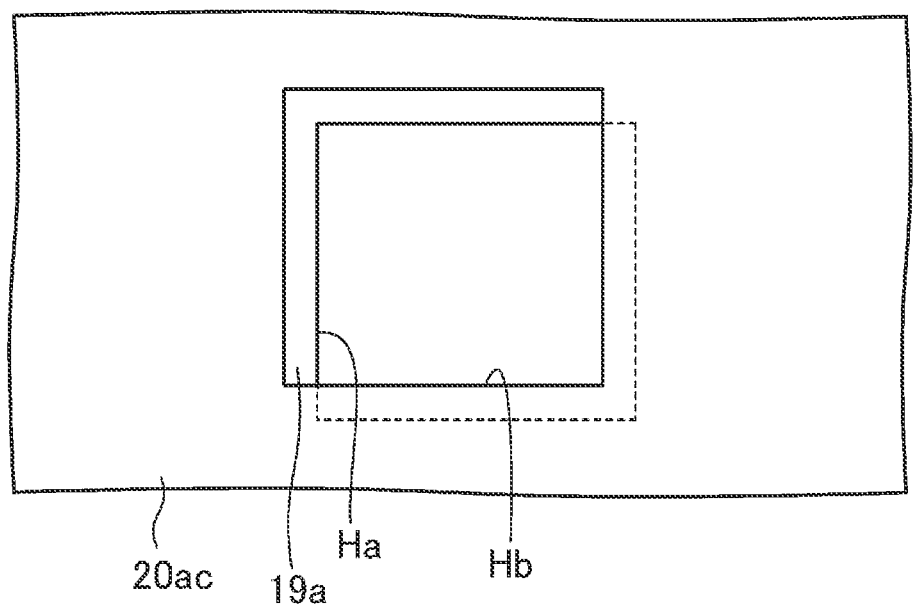

FIG. 10 is a plan view of a third modification of the organic EL display according to the first embodiment of thedisclosure and corresponds to FIG. 5.

Figure 11:
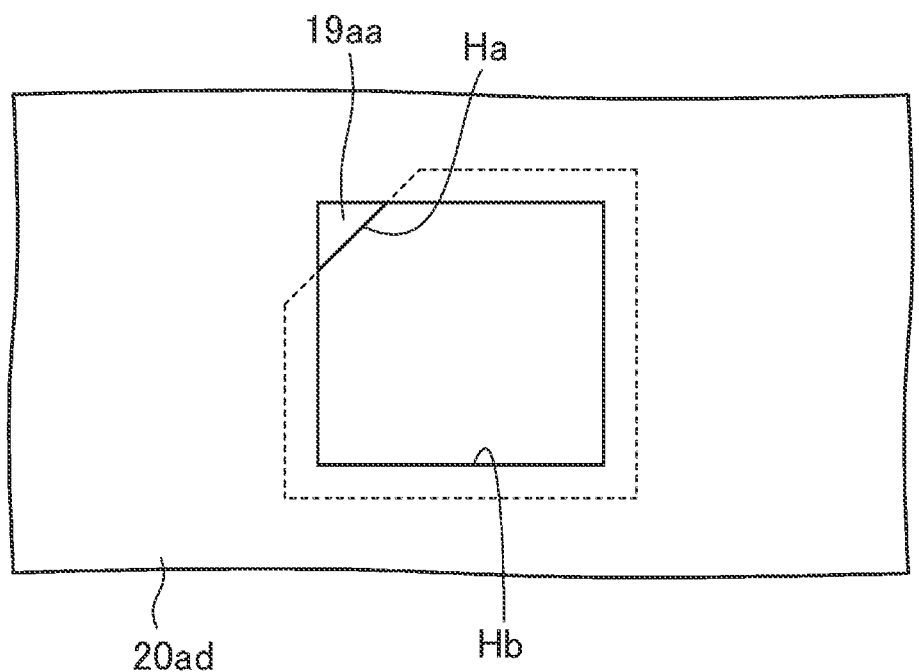

FIG. 11 is a plan view of a fourth modification of the organic EL display according to the first embodiment of the disclosure and corresponds to FIG. 5.

Figure 12:
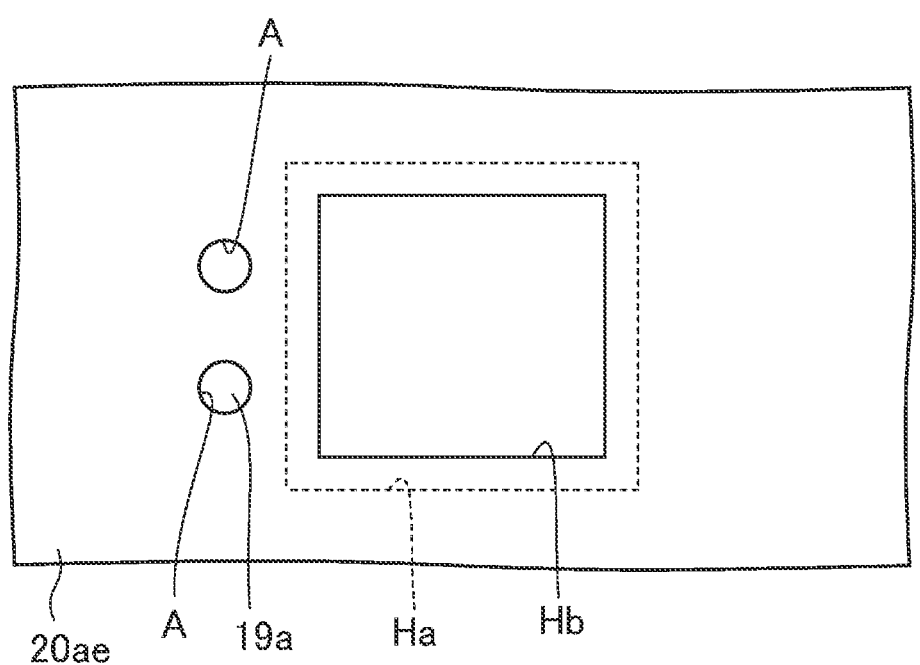

FIG. 12 is a plan view of a fifth modification of the organic EL display according to the first embodiment of the disclosure and corresponds to FIG. 5.

Figure 13:
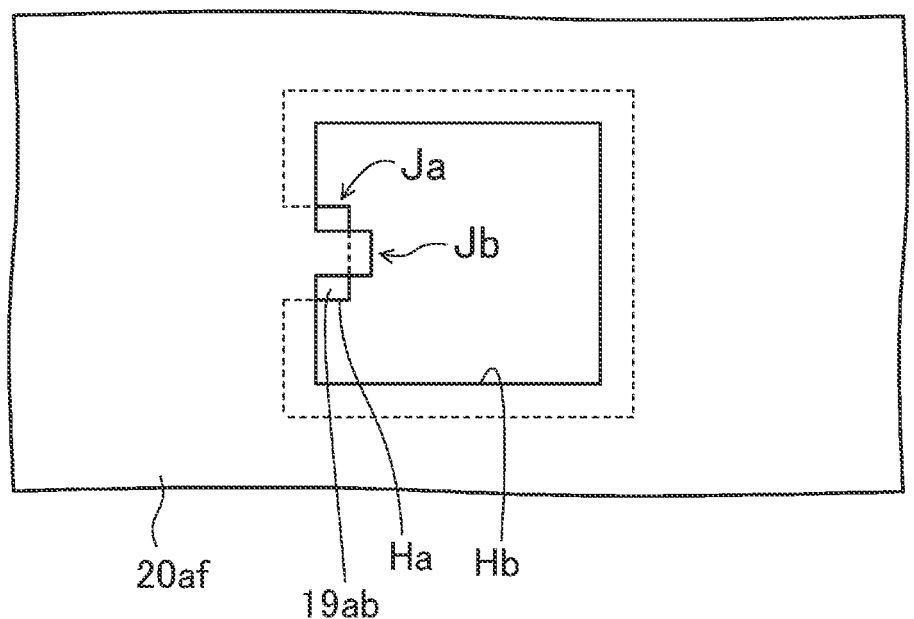

FIG. 13 is a plan view of a sixth modification of the organic EL display according to the first embodiment of the disclosure and corresponds to FIG. 5.

Figure 14:
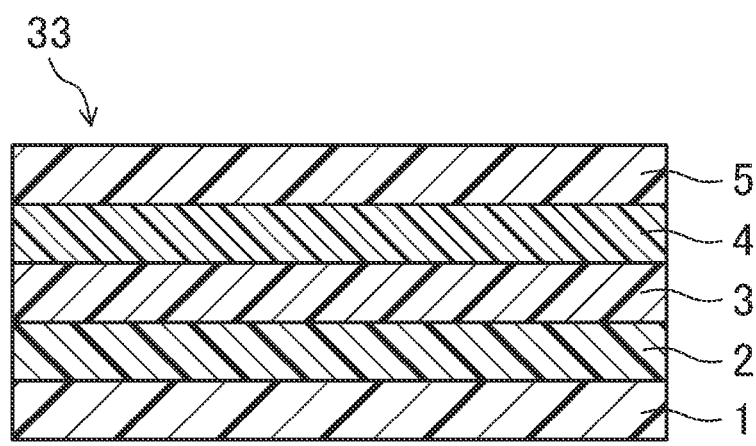

FIG. 14 is a sectional view of an organic EL layer constituting the organic EL display according to the first embodiment of the disclosure.

Figure 1:
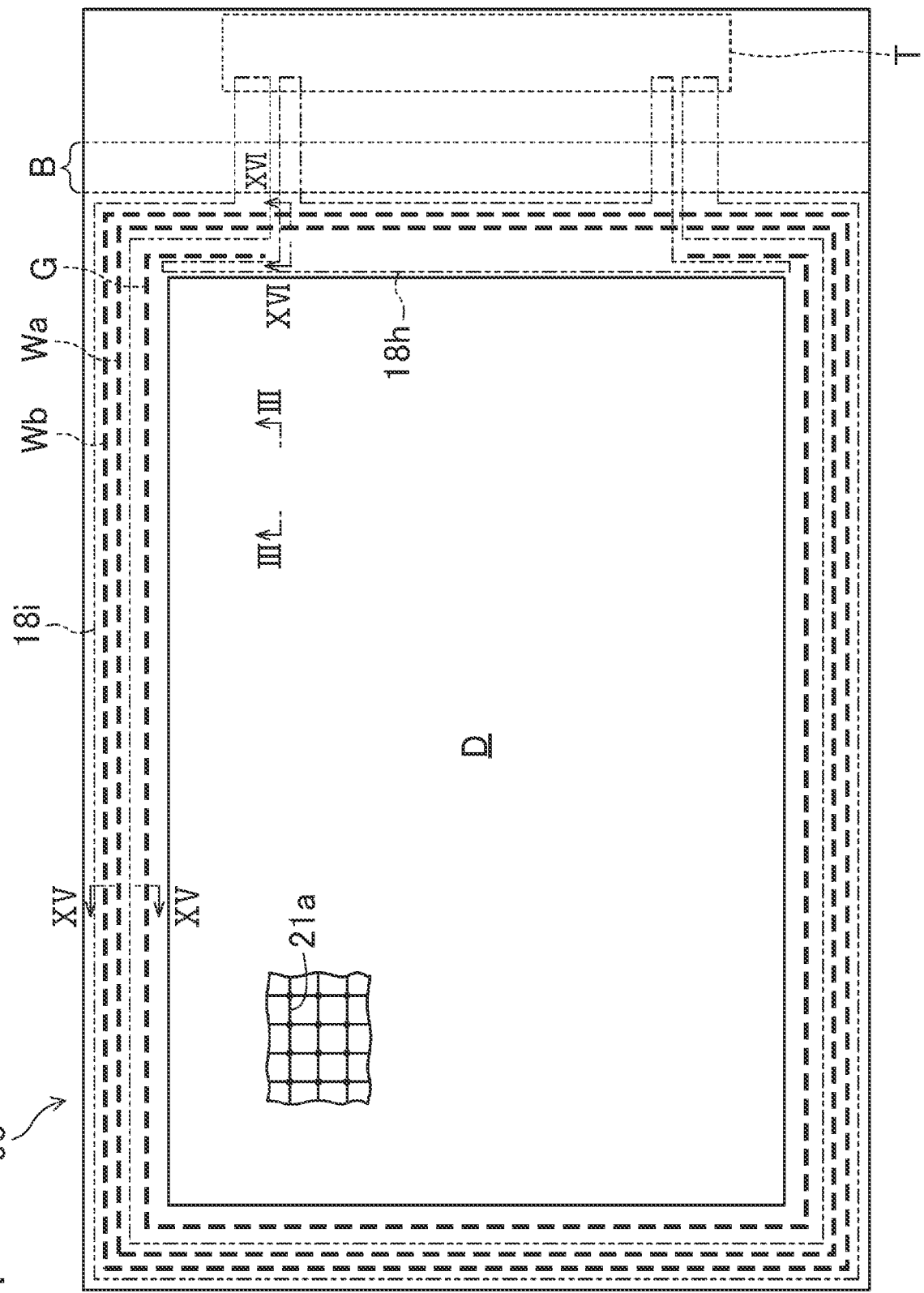
FIG. 1 is a plan view of a schematic configuration of an organic EL display according to a first embodiment of the disclosure.
Figure 15:
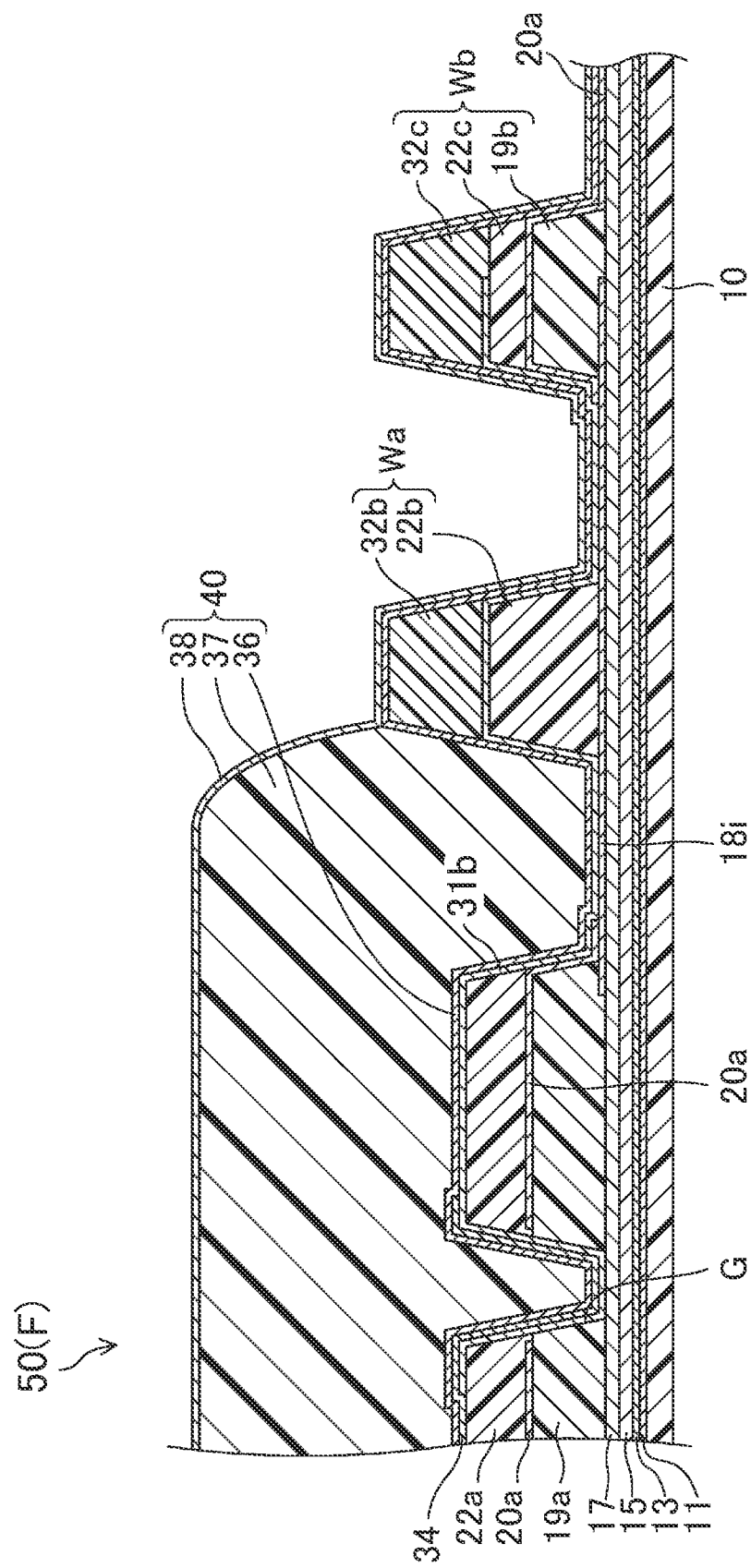

FIG. 15 is a sectional view of a frame region of the organic EL display taken along line XV-XV in FIG. 1.

Figure 16:
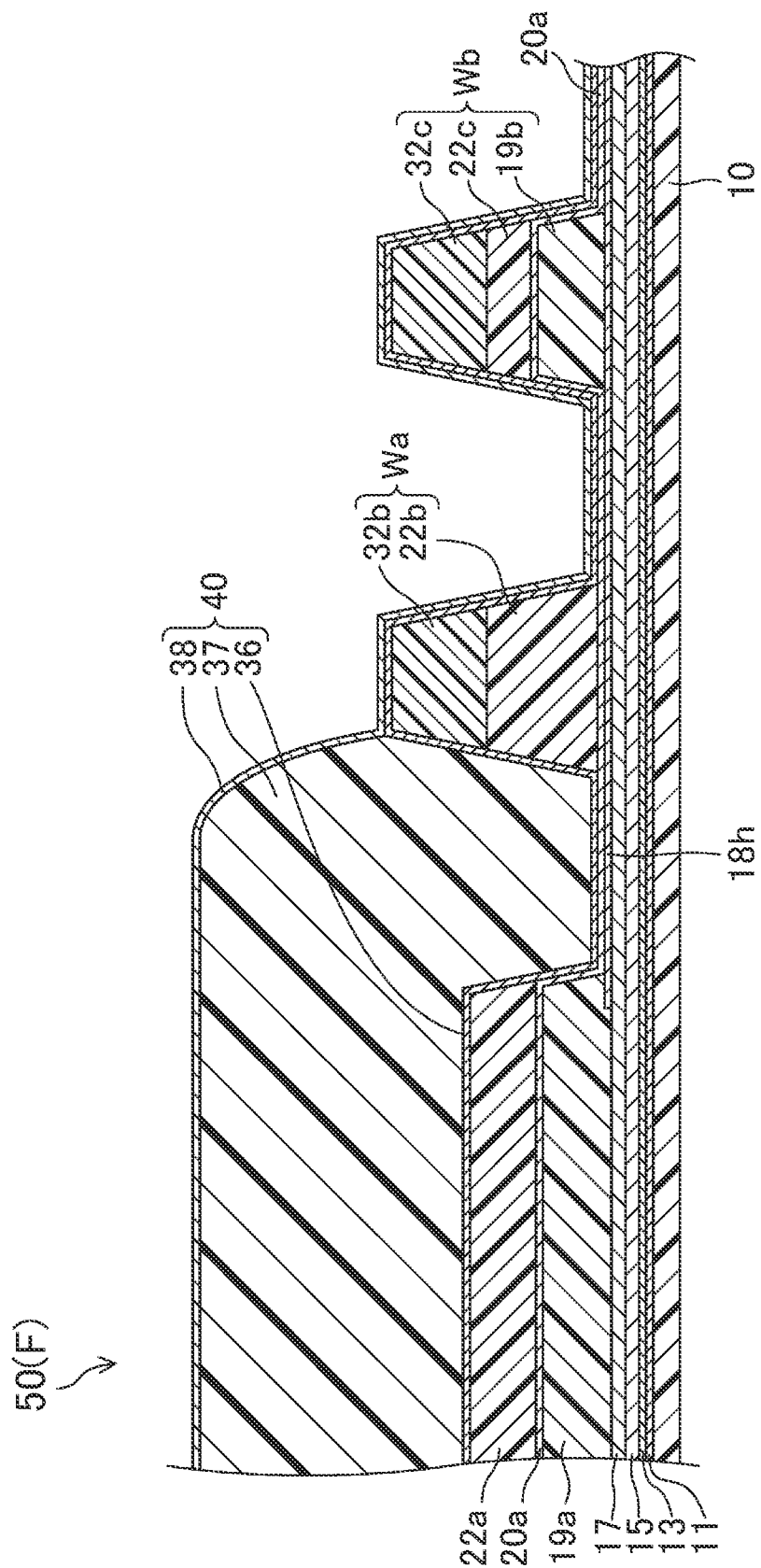

FIG. 16 is a sectional view of the frame region of the organic EL display taken along line XVI-XVI in FIG. 1.

Figure 17:
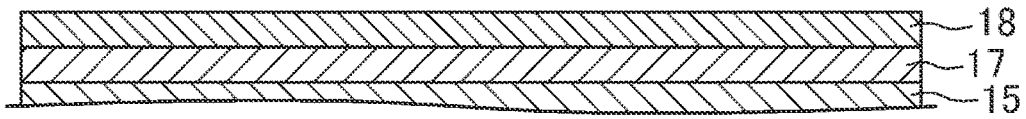

FIG. 17 illustrates part of a TFT layer forming step of forming the TFT layer of the organic EL display according to the first embodiment of the disclosure and is a sectional view corresponding to FIG. 6.

Figure 18:
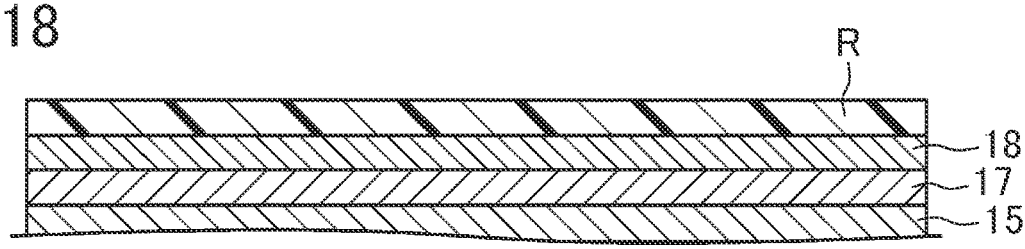

FIG. 18 is a sectional view of part of the TFT layer forming step following FIG. 17.

Figure 19:
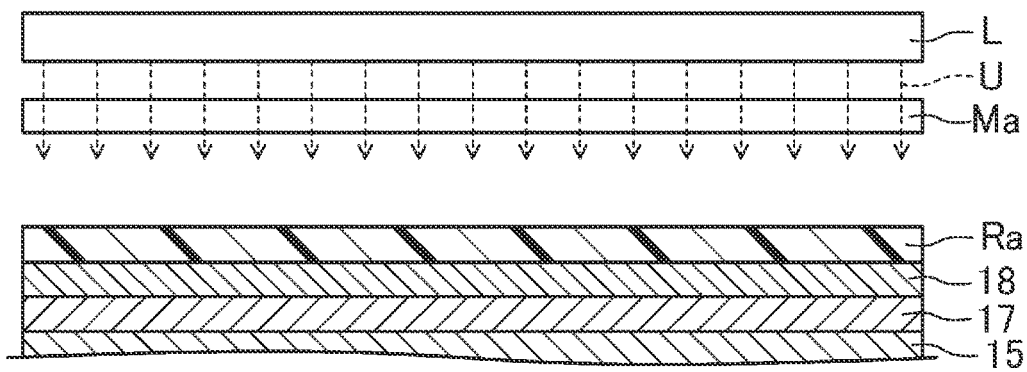

FIG. 19 is a sectional view of part of the TFT layer forming step following FIG. 18.

Figure 20:
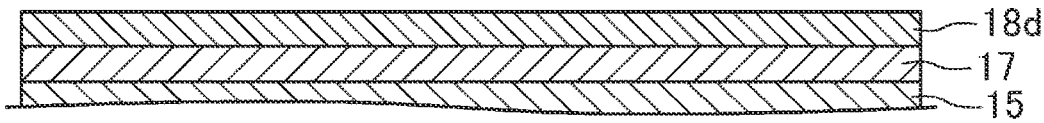

FIG. 20 is a sectional view of part of the TFT layer forming step following FIG. 19.

Figure 21:
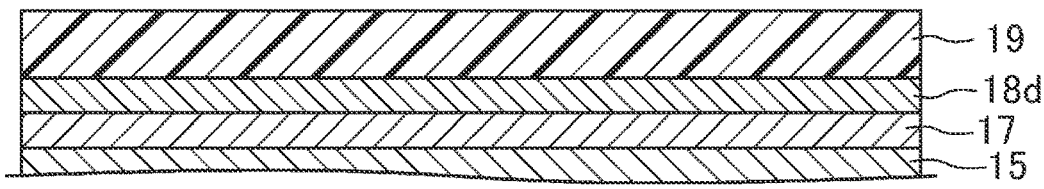

FIG. 21 is a sectional view of part of the TFT layer forming step following FIG. 20.

Figure 22:
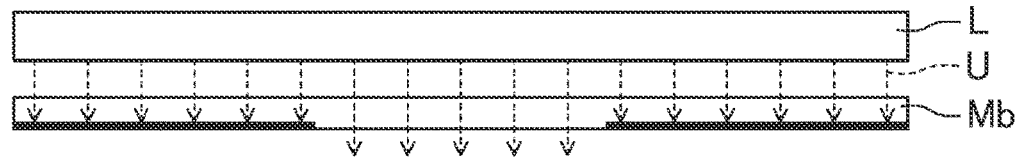

FIG. 22 is a sectional view of part of the TFT layer forming step following FIG. 21.

Figure 23:
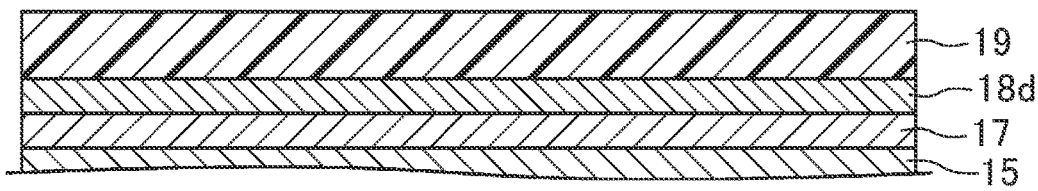

FIG. 23 is a sectional view of part of the TFT layer forming step following FIG. 22.

Figure 24:
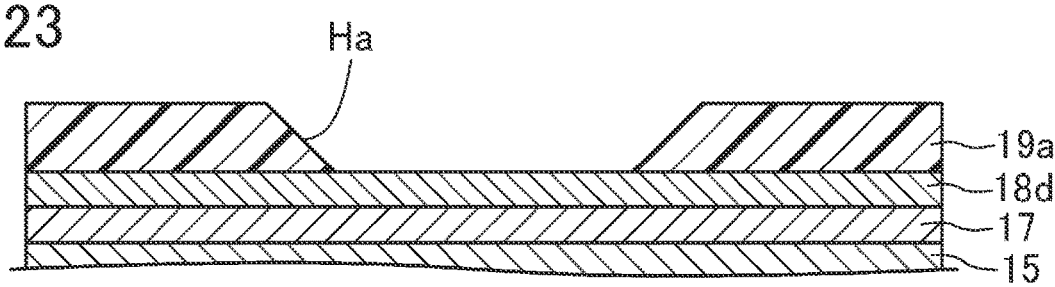

FIG. 24 is a sectional view of part of the TFT layer forming step following FIG. 23.

Figure 25:
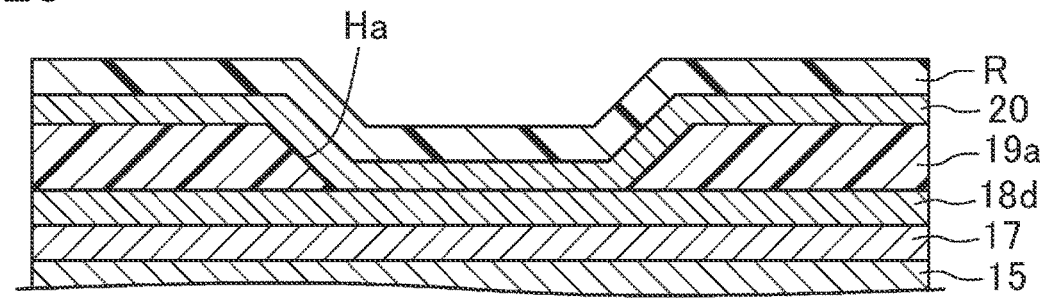

FIG. 25 is a sectional view of part of the TFT layer forming step following FIG. 24.

Figure 26:
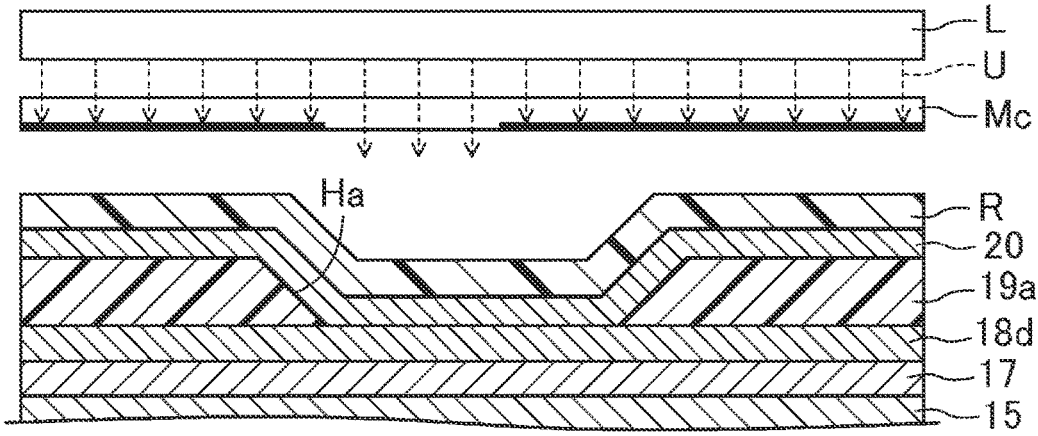

FIG. 26 is a sectional view of part of the TFT layer forming step following FIG. 25.

Figure 27:
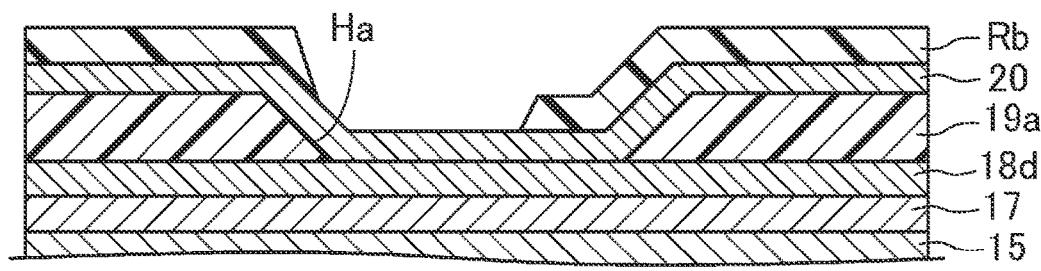

FIG. 27 is a sectional view of part of the TFT layer forming step following FIG. 26.

Figure 28:
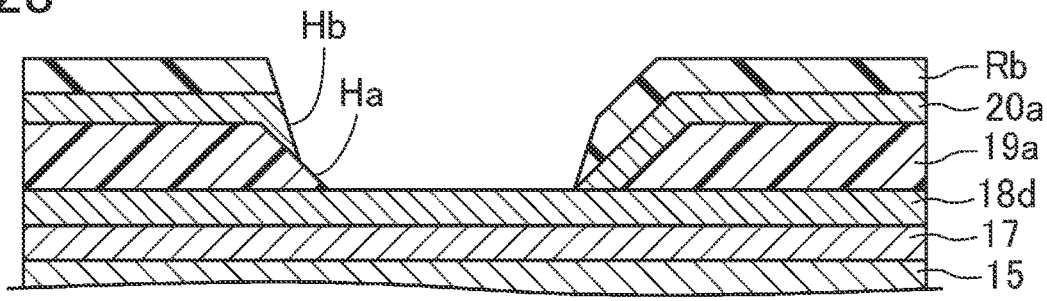

FIG. 28 is a sectional view of part of the TFT layer forming step following FIG. 27.

Figure 29:
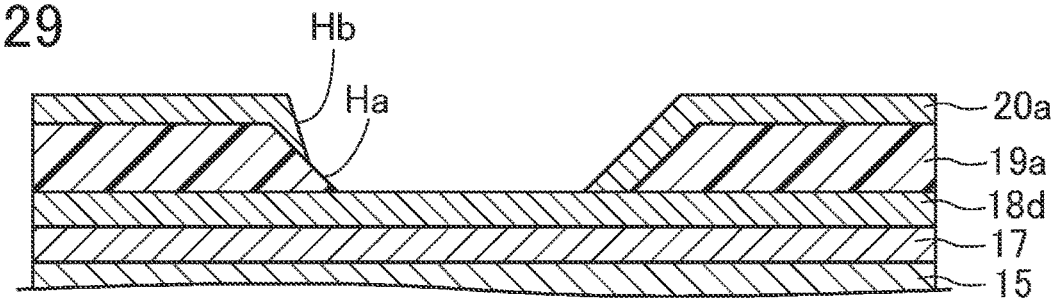

FIG. 29 is a sectional view of part of the TFT layer forming step following FIG. 28.

DESCRIPTION OF EMBODIMENTS

The embodiments of the disclosure will be detailed on the basis of the drawings. It is noted that the disclosure is not limited to the following embodiments.

First Embodiment

Figure 2:
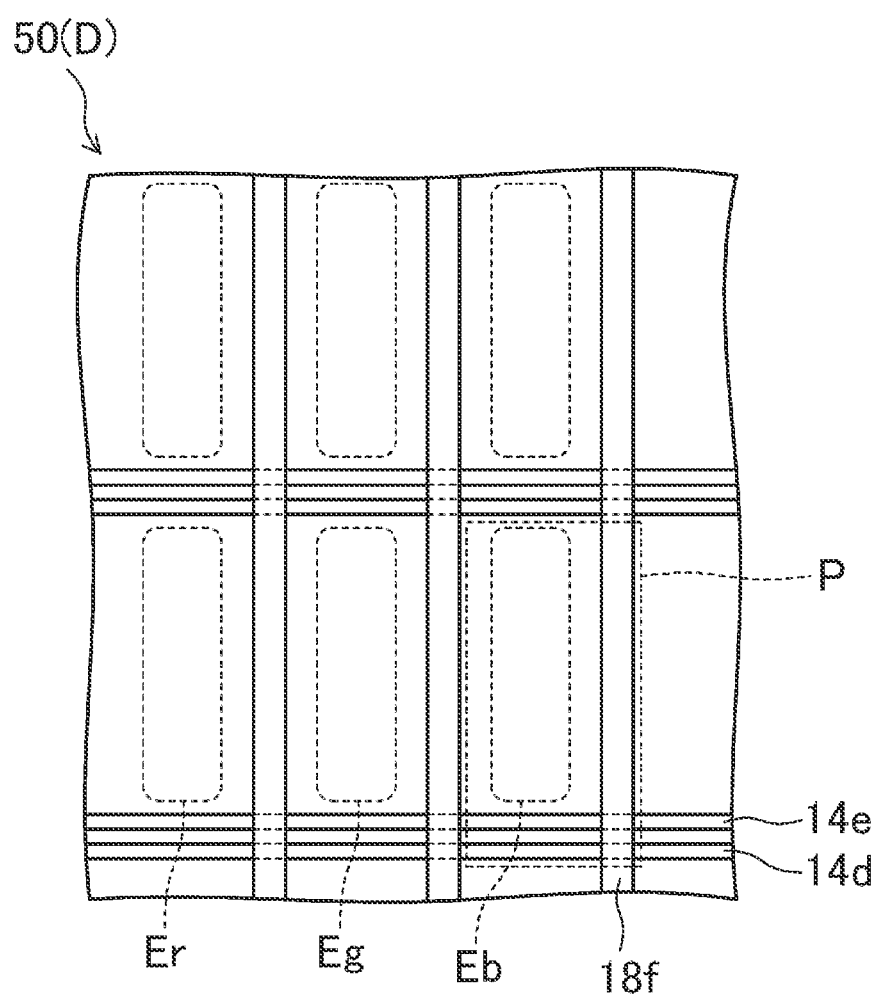
FIG. 2 is a plan view of a display region of the organic EL display according to the first embodiment of the disclosure.
Figure 3:
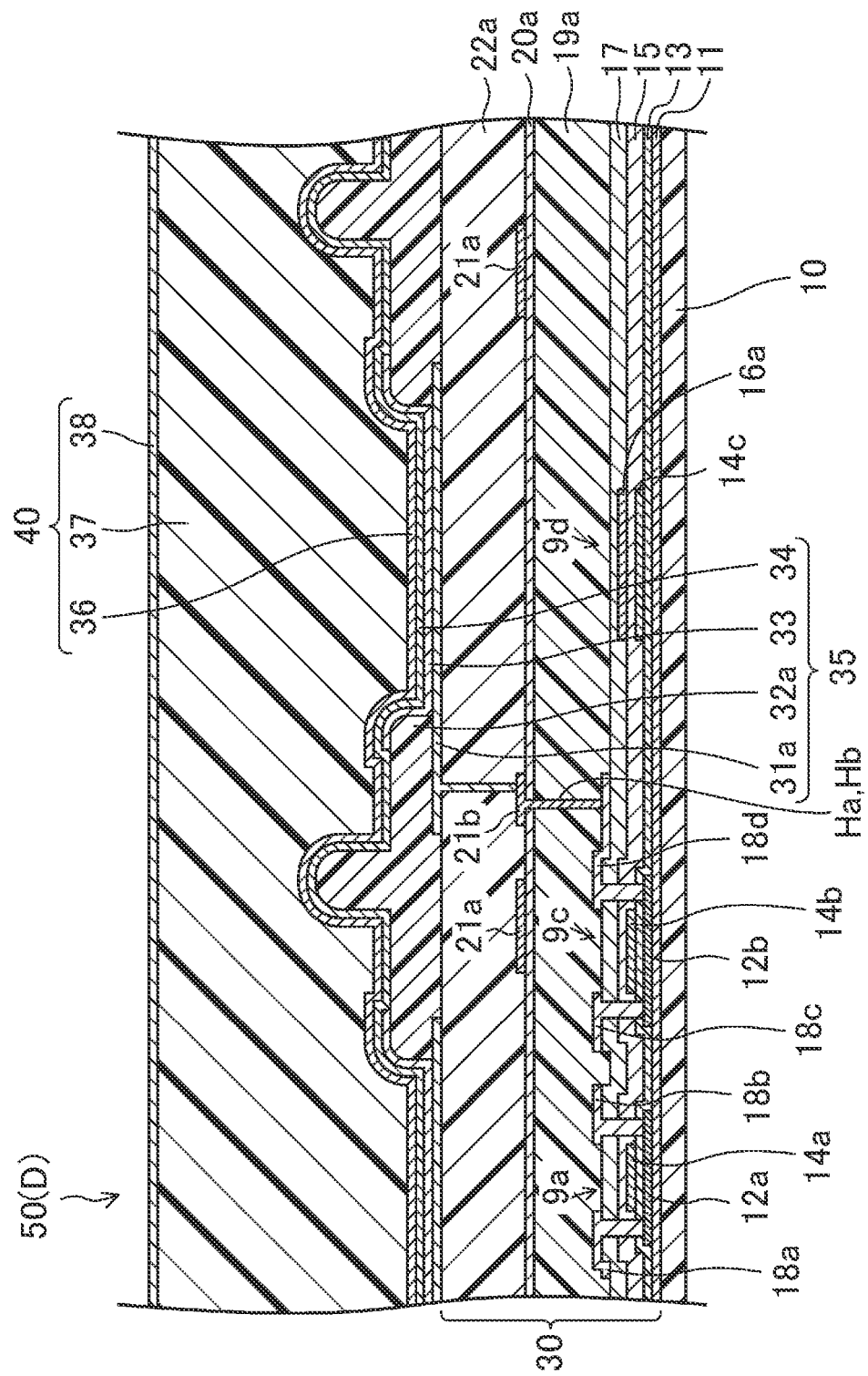
FIG. 3 is a sectional view of the display region of the organic EL display taken along line III-III in FIG. 1.
Figure 4:
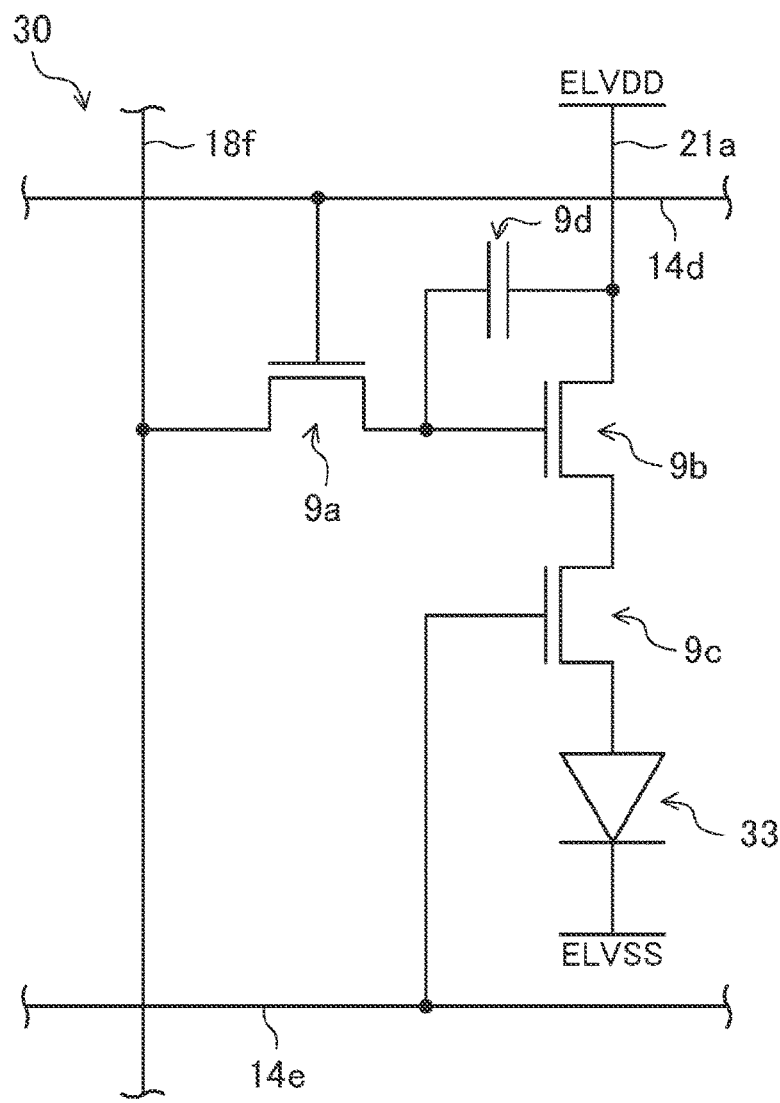
FIG. 4 is an equivalent circuit diagram of a TFT layer constituting the organic EL display according to the first embodiment of the disclosure.

FIG. 1 to FIG. 29 illustrate a first embodiment of a display device and a method for manufacturing the same according to the disclosure. It is noted that in the following embodiments describe, by way of example, an organic EL display including an organic EL element layer, as a display device including a light-emitting element layer. Here, FIG. 1 is a plan view of a schematic configuration of an organic EL display 50 according to this embodiment. Further, FIG. 2 is a plan view of a display region D of the organic EL display 50. Further, FIG. 3 is a sectional view of the display region D of the organic EL display 50 taken along line III-III in FIG. 1. FIG. 4 is an equivalent circuit diagram of a TFT layer 30 constituting the organic EL display 50. Further, FIG. 5 is a plan view of a first contact hole Ha and a second contact hole Hb respectively formed in a first flattening film 19a and a third interlayer insulating film 20a both constituting the TFT layer 30 of the organic EL display 50, as well as a plan view of their vicinity. FIG. 6 is a sectional view taken along line VI-VI in FIG. 5. Further, FIG. 7 is a plan view of a first modification of the organic EL display 50 and corresponds to FIG. 5. Further, FIG. 8 is a sectional view taken along line VIII-VIII in FIG. 7. Further, FIG. 9, FIG. 10, FIG. 11, FIG. 12, and FIG. 13 are plan views of a second modification, a third modification, a fourth modification, a fifth modification and a sixth modification of the organic EL display 50 and correspond to FIG. 5. Further, FIG. 14 is a sectional view of an organic EL layer 33 constituting the organic EL display 50. Further, FIG. 15 and FIG. 16 are sectional views of a frame region F of the organic EL display 50 taken along line XV-XV and line XVI-XVI in FIG. 1.

As illustrated in FIG. 1, the organic EL display 50 has the display region D provided in, for instance, a rectangular shape and configured to perform display, and the frame region F provided in a rectangular frame shape around the display region D. It is noted that although this embodiment describes, by way of example, the display region D having a rectangular shape, substantially rectangular shapes, including a shape with an arc-shaped side, a shape with arc-shaped corner, and a shape with part of a side being cut, are also included in this rectangular shape.

The display region D has a plurality of sub-pixels P arranged in matrix, as illustrated in FIG. 2. Further, as illustrated in FIG. 2, a sub-pixel P with a red light-emission region Er for red display, a sub-pixel P with a green light-emission region Eg for green display, and a sub-pixel P with a blue light-emission region Eb for blue display, for instance, are provided in the display region D so as to be adjacent to each other. It is noted that in the display region D, three adjacent sub-pixels P having a red light-emission region Er, a green light-emission region Eg, and a blue light-emission region Eb, for instance, constitute a single pixel.

The frame region F includes a terminal section T provided at the right end of FIG. 1 so as to extend in one direction (longitudinal direction in the drawing). The frame region F also includes, as illustrated in FIG. 1, a bending portion B provided between the display region D and the terminal section T so as to extend in one direction (longitudinal direction in the drawing); here, the bending portion B is 1800 (U-shape) bendable about a bending axis in the longitudinal direction of the drawing. Further, the terminal section T includes a plurality of terminals arranged in a direction where the terminal section T extends. Further, in the frame region F, the first flattening film 19a and a second flattening film 22a, both of which will be described later on, have a trench G having a substantial C-shape in a plan view and provided to pass through the first flattening film 19a and second flattening film 22a, as illustrated in FIG. 1 and FIG. 15. Here, the trench G is provided in the form of a substantial C-shape so as to be open toward the terminal section T in a plan view, as illustrated in FIG. 1.

The organic EL display 50 includes the following, as illustrated in FIG. 3: a resin substrate layer 10 provided as a base substrate; a TFT layer 30 provided on the resin substrate layer 10; an organic EL element layer 35 provided on the TFT layer 30 as a light-emitting element layer; and a sealing film 40 provided on the organic EL element layer 35.

The resin substrate layer 10 is made of, for instance, polyimide resin.

The TFT layer 30 includes the following, as illustrated in FIG. 3: a base coat film 11 provided on the resin substrate layer 10; and a plurality of first TFTs 9a, a plurality of second TFTs 9b (see FIG. 4), a plurality of third TFTs 9c and a plurality of capacitors 9d all provided on the base coat film 11. The TFT layer 30 also includes, as illustrated in FIG. 3, the first flattening film 19a, the third interlayer insulating film 20a, and the second flattening film 22a sequentially provided on each first TFT 9a, each second TFT 9b, each third TFT 9c and each capacitor 9d.

The TFT layer 30 includes the following sequentially stacked on the base coat film 11, as illustrated in FIG. 3: semiconductor layers 12a and 12b; a gate insulating film 13; gate electrodes 14a and 14b, and a lower conductive layer 14c; a first interlayer insulating film 15; an upper conductive layer 16a; a second interlayer insulating film 17; source electrodes 18a and 18c, and drain electrodes 18b and 18d; the first flattening film 19a; the third interlayer insulating film 20a; a power-source line 21a and a relay electrode 21b; and the second flattening film 22a.

The TFT layer 30a includes, as illustrated in FIGS. 2 and 4, a plurality of gate lines 14d provided in the display region D so as to extend in parallel with each other in the lateral directions of the drawings. The TFT layer 30 also includes, as illustrated in FIGS. 2 and 4, a plurality of light-emission control lines 14e provided in the display region D so as to extend in parallel with each other in the lateral directions of the drawings. It is noted that the gate lines 14d and the light-emission control lines 14e are formed of the same material and in the same layer as the gate electrodes 14a and 14b and the lower conductive layer 14c. It is also noted that the individual light-emission control lines 14e are provided to be adjacent to the individual gate lines 14d, as illustrated in FIG. 2. Further, the TFT layer 30 also includes, as illustrated in FIGS. 2 and 4, a plurality of source lines 18f provided in the display region D so as to extend in parallel with each other in the longitudinal directions of the drawings. It is noted that the source lines 18f are formed of the same material and in the same layer as the source electrodes 18a and 18c and the drain electrodes 18b and 18d. It is also noted that in the TFT layer 30, the power-source line 21a is provided in lattice in the display region D, as illustrated in FIG. 1. It is also noted that in the TFT layer 30, each sub-pixel P includes a first TFT 9a, a second TFT 9b, a third TFT 9c, and a capacitor 9d, as illustrated in FIG. 4.

The base coat film 11 is composed of, for instance, an inorganic insulating monolayer or laminated film of silicon nitride, silicon oxide, silicon oxide nitride or other materials.

The first TFT9a in each sub-pixel P is electrically connected to a corresponding gate line 14d, a corresponding source line 18f and a corresponding second TFT9b, as illustrated in FIG. 4. Further, the first TFT9a includes the following sequentially provided on the base coat film 11, as illustrated in FIG. 3: the semiconductor layer 12a; the gate insulating film 13; the gate electrode 14a; the first interlayer insulating film 15; the second interlayer insulating film 17; and the source electrode 18a and the drain electrode 18b.

Here, the semiconductor layer 12a is provided in the form of an island on the base coat film 11, as illustrated in FIG. 3 and has a channel region, a source region and a drain region, as described later on. Further, the semiconductor layer 12a and the semiconductor layer 12b, which will be described later on, are formed of, for instance, a low-temperature polysilicon film, an In-Ga—Zn-O oxide semiconductor film or other kinds of film. Further, the gate insulating film 13 is provided to cover the semiconductor layer 12a, as illustrated in FIG. 3. Further, the gate electrode 14a is provided on the gate insulating film 13 so as to overlap the channel region of the semiconductor layer 12a, as illustrated in FIG. 3. Further, the first interlayer insulating film 15 and the second interlayer insulating film 17 are provided sequentially so as to cover the gate electrode 14a, as illustrated in FIG. 3. Further, the source electrode 18a and the drain electrode 18b are spaced from each other on the second interlayer insulating film 17, as illustrated in FIG. 3. The source electrode 18a and the drain electrode 18b are also electrically connected respectively to the source region and drain region of the semiconductor layer 12a via respective contact holes formed in a stack of the gate insulating film 13, the first interlayer insulating film 15 and the second interlayer insulating film 17, as illustrated in FIG. 3. It is noted that the gate insulating film 13, the first interlayer insulating film 15 and the second interlayer insulating film 17, as well as the third interlayer insulating film 20a, which will be described later on, are composed of, for instance, an inorganic insulating monolayer or laminated film of silicon nitride, silicon oxide, silicon oxide nitride, aluminum oxide or other materials.

The second TFT 9b in each sub-pixel P is electrically connected to a corresponding first TFT 9a, a corresponding power-source line 21a and a corresponding third TFT 9c, as illustrated in FIG. 4. It is noted that the second TFT9b has substantially the same structure as the first TFT 9a and the third TFT 9c, which will be described later on.

The third TFT 9c in each sub-pixel P is electrically connected to a corresponding second TFT 9b, a corresponding power-source line 21a and a corresponding light-emission control line 14e, as illustrated in FIG. 4. The third TFT 9c also includes the following sequentially provided on the base coat film 11, as illustrated in FIG. 3: the semiconductor layer 12b; the gate insulating film 13; the gate electrode 14b; the first interlayer insulating film 15; the second interlayer insulating film 17; and the source electrode 18c and the drain electrode 18d. Here, the semiconductor layer 12b is provided in the form of an island on the base coat film 11, as illustrated in FIG. 3, and has a channel region, a source region, and a drain region, like the semiconductor layer 12a. Further, the gate insulating film 13 is provided to cover the semiconductor layer 12b, as illustrated in FIG. 3. Further, the gate electrode 14b is provided on the gate insulating film 13 so as to overlap the channel region of the semiconductor layer 12b, as illustrated in FIG. 3. Further, the first interlayer insulating film 15 and the second interlayer insulating film 17 are provided sequentially so as to cover the gate electrode 14b, as illustrated in FIG. 3. Further, the source electrode 18c and the drain electrode 18d are spaced from each other on the second interlayer insulating film 17, as illustrated in FIG. 3. The source electrode 18c and the drain electrode 18d are also electrically connected respectively to the source region and drain region of the semiconductor layer 12b via respective contact holes formed in a stack of the gate insulating film 13, the first interlayer insulating film 15 and the second interlayer insulating film 17, as illustrated in FIG. 3. Further, the drain electrode 18d is electrically connected to the relay electrode 21b via the first contact hole Ha formed in the first flattening film 19a, and via the second contact hole Hb formed in the third interlayer insulating film 20a, as illustrated in FIG. 3.

It is noted that although the first TFTs 9a, the second TFTs 9b, and the third TFTs 9c fall under a top-gate type in this embodiment by way of example, the first TFTs 9a, the second TFTs 9b, and the third TFTs 9c may be bottom-gate TFTs.

The capacitor 9d in each sub-pixel P is electrically connected to a corresponding first TFT 9a and a corresponding power-source line 21a, as illustrated in FIG. 4. Here, the capacitor 9d includes the following, as illustrated in FIG. 3: the lower conductive layer 14c formed in the same layer and of the same material as the gate electrode 14a and other components; the first interlayer insulating film 15 provided to cover the lower conductive layer 14c; and the upper conductive layer 16a provided on the first interlayer insulating film 15 so as to overlap the lower conductive layer 14c. It is noted that the upper conductive layer 16a is electrically connected to the power-source line 21a via a contact hole (not shown) formed in the second interlayer insulating film 17, first flattening film 19a and third interlayer insulating film 20a.

The first flattening film 19a and the second flattening film 22a, as well as an edge cover 32a, which will be described later on, are composed of an organic resin material, including polyimide resin, acrylic resin, and novolak resin.

Here, the foregoing electrical connection structure between the drain electrode 18d and the relay electrode 21b will be detailed with reference to FIG. 5 and FIG. 6.

The first flattening film 19a has the first contact hole Ha formed to pass through the first flattening film 19a and formed for electrically connecting the drain electrode 18d and the relay electrode 21b together, as illustrated in FIG. 6. Further, the third interlayer insulating film 20a has the second contact hole Hb formed to pass through the third interlayer insulating film 20a and formed for electrically connecting the drain electrode 18d and the relay electrode 21b together, as illustrated in FIG. 6. Here, the first contact hole Ha is formed in a rectangular shape (for instance, a length of about 11 μm×a width of about 9.5 μm) in a plan view, as illustrated in FIG. 5. Further, the second contact hole Hb is formed in a rectangular shape (for instance, a length of about 8 μm×a width of about 9.5 μm) in a plan view, as illustrated in FIG. 5. Further, a portion (a length of about 8 μm×a width of about 1.5 μm) along one side (left side in FIG. 5) at the edge of the first flattening film 19a provided with the first contact hole Ha is exposed from the edge of the third interlayer insulating film 20a provided with the second contact hole Hb, as illustrated in FIG. 5 and FIG. 6. Accordingly, the portion along this one side (left side in FIG. 5) at the edge of the first flattening film 19a provided with the first contact hole Ha is not covered by the third interlayer insulating film 20a, thus enabling unnecessary substances contained in the first flattening film 19a, such as moisture and degasifying elements, to be discharged from this one side at the edge of the first flattening film 19a, thereby preventing the relay electrode 21b from film coming-off or film peel. Further, a portion along the other three sides (upper side, right side and lower side in FIG. 5) at the edge of the first flattening film 19a provided with the first contact hole Ha is covered by the third interlayer insulating film 20a; accordingly, this can prevent the other three sides at the edge of the first flattening film 19a from a break that is caused by alternation (e.g., oxidation), insufficient film thickness or a level difference in the relay electrode 21b.

It is noted that although this embodiment has provided an example configuration where a portion along one side at the edge of the first flattening film 19a is exposed from the edge of the third interlayer insulating film 20a, at least a part of the edge of the first flattening film 19a provided with the first contact hole Ha needs to be exposed from the edge of the third interlayer insulating film 20a provided with the second contact hole Hb, as described in the following modifications.

First Modification

In a first modification, a portion along the four sides at the edge of the first flattening film 19a provided with the first contact hole Ha is exposed continuously from the edge of a third interlayer insulating film 20aa provided with the second contact hole Hb, as illustrated in FIG. 7 and FIG. 8. This configuration enables unnecessary substances contained in the first flattening film 19a, such as moisture and degasifying elements, to be discharged from the four sides at the edge of the first flattening film 19a, thereby further preventing the relay electrode 21b from film coming-off or film peel. It is noted that this modification has provided an example configuration where a portion along the four sides at the edge of the first flattening film 19a is exposed continuously from the edge of the third interlayer insulating film 20aa, the portion along the four sides at the edge of the first flattening film 19a may be exposed discontinuously from the edge of the third interlayer insulating film 20aa.

Second Modification

In a second modification, a portion (left side and right side in the drawing) along two facing sides at the edge of the first flattening film 19a provided with the first contact hole Ha is exposed from the edge of a third interlayer insulating film 20ab provided with the second contact hole Hb, as illustrated in FIG. 9. This configuration enables unnecessary substances contained in the first flattening film 19a, such as moisture and degasifying elements, to be discharged from the two facing sides at the edge of the first flattening film 19a, thereby preventing the relay electrode 21b from film coming-off or film peel. The configuration can also prevent the other two facing sides at the edge of the first flattening film 19a from a break that is caused by alternation (e.g., oxidation), insufficient film thickness or a level difference in the relay electrode 21b.

Third Modification

In a third modification, a portion along two adjacent sides (left side and upper side in the drawing) at the edge of the first flattening film 19a provided with the first contact hole Ha is exposed continuously from the edge of a third interlayer insulating film 20ac provided with the second contact hole Hb, as illustrated in FIG. 10. This configuration enables unnecessary substances contained in the first flattening film 19a, such as moisture and degasifying elements, to be discharged from the two adjacent sides at the edge of the first flattening film 19a, thereby preventing the relay electrode 21b from film coming-off or film peel. The configuration can also prevent the other two adjacent sides at the edge of the first flattening film 19a from a break that is caused by alternation (e.g., oxidation), insufficient film thickness or a level difference in the relay electrode 21b. It is noted that this modification has provided an example configuration where a portion along two adjacent sides at the edge of the first flattening film 19a is exposed continuously from the edge of the third interlayer insulating film 20ac, the portion along the two adjacent sides at the edge of the first flattening film 19a may be exposed discontinuously from the edge of the third interlayer insulating film 20ac.

Fourth Modification

In a fourth modification, the second contact hole Hb of a third interlayer insulating film 20ad is formed in a rectangular shape (for instance, about 11 µm×about 11 µm) in a plan view, and a part of the edge of a first flattening film 19aa provided with the first contact hole Ha is exposed from one corner (upper left part in the drawing; a length of about 4 µm×a width of about 4 µm) at the edge of the third interlayer insulating film 20ad provided with the second contact hole Hb, as illustrated in FIG. 11. This configuration enables unnecessary substances contained in the first flattening film 19aa, such as moisture and degasifying elements, to be discharged from the first flattening film 19aa exposed from this single corner at the edge of the third interlayer insulating film 20ad, thereby preventing the relay electrode 21b from film coming-off or film peel. The configuration can also prevent the four sides excluding the corner at the edge of the first flattening film 19aa from a break that is caused by alternation (e.g., oxidation), insufficient film thickness or a level difference in the relay electrode 21b. It is noted that this modification has described an example configuration where a part of the edge of the first flattening film 19aa is exposed from one corner at the edge of the third interlayer insulating film 20ad, the part of the edge of the first flattening film 19aa may be exposed from two, three or four corners at the edge of the third interlayer insulating film 20ad.

Fifth Modification

In a fifth modification, a third interlayer insulating film 20ae provided with the second contact hole Hb has, at its edge, two openings A provided (for instance, about 4 µm in diameter) in the form of an island passing through the third interlayer insulating film 20ae, and a part of the edge of the first flattening film 19a provided with the first contact hole Ha is exposed from the individual openings A, as illustrated in FIG. 12. This configuration enables unnecessary substances contained in the first flattening film 19a, such as moisture and degasifying elements, to be discharged from the first flattening film 19a exposed from the individual openings A of the third interlayer insulating film 20ae, thereby preventing the relay electrode 21b from film coming-off or film peel. The configuration can also prevent the four sides at the edge of the first flattening film 19a from a break that is caused by alternation (e.g., oxidation), insufficient film thickness or a level difference in the relay electrode 21b. It is noted that the openings A, although having a circular shape in a plan view in this modification by way of example, may have a shape, including polygons, in a plan view. Further, the openings A are provided on a slope and/or upper surface at the edge of the third interlayer insulating film 20ae provided with the second contact hole Hb.

Sixth Modification

In a sixth modification, a first flattening film 19ab provided with the first contact hole Ha has, at its edge, a first protrusion Ja (for instance, a length of about 6 µm×a width of about 2 µm) protruding inward in a plan view; in addition, a third interlayer insulating film 20af has, at its edge, a second protrusion (for instance, a length of about 2 µm×a width of about 4 µm) protruding inward in a plan view and provided to overlap the first protrusion Ja; in addition, both ends (for instance, a length of about 2 µm×a width of about 2 µm) of the first protrusion Ja are exposed from the second protrusion Jb, as illustrated in FIG. 13. This configuration enables unnecessary substances contained in the first flattening film 19ab, such as moisture and degasifying elements, to be discharged from the first protrusion Ja exposed from the second protrusion Jb, thereby preventing the relay electrode 21b from film coming-off or film peel. The configuration can also prevent the four sides at the edge of the first flattening film 19ab from a break that is caused by alternation (e.g., oxidation), insufficient film thickness or a level difference in the relay electrode 21b.

It is noted that although this embodiment and the first to sixth modifications have provided, by way of example, a contact hole having basically a rectangular shape in a plan view, the shape of a contact hole in a plan view may be a circle or other polygons, including a polygon having an arc-shaped corner.

The organic EL element layer 35 is composed of a plurality of organic EL elements arranged in matrix and includes, as illustrated in FIG. 3, a plurality of first electrodes 31a, the edge cover 32a, the plurality of organic EL layers 33, and the second electrode 34 sequentially provided on the TFT layer 30.

The plurality of first electrodes 31a are provided in matrix on the second flattening film 22a so as to correspond to the plurality of sub-pixels P, as illustrated in FIG. 3. Here, the first electrodes 31a are each electrically connected to the drain electrode 18d of a corresponding third TFT 9c via the first contact hole Ha, formed in the first flattening film 19a, via the second contact hole Hb, formed in the third interlayer insulating film 20a, via the relay electrode 21b, and via a contact hole formed in the second flattening film 22a, as illustrated in FIG. 3 and FIG. 6. Further, the first electrodes 31a have the function of injecting holes (positive holes) into the organic EL layers 33. Further, the first electrodes 31a are more desirably formed of a material having a large work function, in order to improve the efficiency of hole injection into the organic EL layers 33. Here, the first electrodes 31a are made of a metal material, including silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Further, the first electrodes 31a may be made of an alloy of, for instance, astatine (At) and astatine oxide ($AtO_2$). Furthermore, the first electrodes 31a may be made of a conductive oxide, such as tin oxide (SnO), zinc oxide (ZnO), indium tin oxide (ITO), or indium zinc oxide (IZO). Further, the first electrodes 31a may be formed of a stack of multiple layers made of the above materials. It is noted that examples of a compound material having a large work function include indium tin oxide (ITO) and indium zinc oxide (IZO).

The edge cover 32a is provided in lattice over the individual perimeters of the first electrodes 31a so as to be common to the plurality of sub-pixels P, as illustrated in FIG. 3.

The plurality of organic EL layers 33 are disposed on the respective first electrodes 31a and are provided in matrix so as to correspond to the plurality of sub-pixels P, as illustrated in FIG. 3. Here, each organic EL layer 33 includes the following sequentially provided on the first electrode 31a, as illustrated in FIG. 14: a hole injection layer 1, a hole transport layer 2, a light-emitting layer 3, an electron transport layer 4, and an electron injection layer 5.

The hole injection layer 1 is also called an anode buffer layer and has the function of bringing the energy levels of the first electrode 31a and organic EL layer 33 close to each other to improve the efficiency of hole injection from the first electrode 31a to the organic EL layer 33. Here, examples of the material of the hole injection layer 1 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 2 has the function of improving the efficiency of hole transport from the first electrode 31a to the organic EL layer 33. Here, examples of the material of the hole transport layer 2 include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The light-emitting layer 3 is a region where holes and electrons are respectively injected from the first electrode 31a and second electrode 34 applied with voltage, and where the holes and electrons rejoin. Here, the light-emitting layer 3 is made of a material having high efficiency of light emission. Moreover, examples of the material of the light-emitting layer 3 include a metal oxinoid compound [8-hydroxyquinoline metal complex], a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzthiazole derivative, a styryl derivative, a styrylamine derivative, a bisstyrylbenzene derivative, a trisstyrilbenzene derivative, a perylene derivative, a perynone derivative, an aminopyrene derivative, a pyridine derivative, a rhodamine derivative, an acridine derivative, phenoxazone, a quinacridone derivative, rubrene, poly-p-phenylenevinylene, and polysilane.

The electron transport layer 4 has the function of moving electrons to the light-emitting layer 3 efficiently. Here, the electron transport layer 4 is composed of an organic compound, including an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 5 has the function of bringing the energy levels of the second electrode 34 and organic EL layer 33 close to each other to improve the efficiency of electron injection from the second electrode 34 into the organic EL layer 33; this function can lower voltage for driving each organic EL element constituting the organic EL element layer 35. It is noted that the electron injection layer 5 is also called a cathode buffer layer. Here, examples of the material of the electron injection layer 5 include an inorganic alkali compound such as lithium fluoride (LiF), magnesium fluoride ($MgF_2$), calcium fluoride ($CaF_2$), strontium fluoride ($SrF_2$), and barium fluoride ($BaF_2$), as well as an aluminum oxide ($Al_2O_3$) and strontium oxide (SrO).

The second electrode 34 is provided over the individual organic EL layers 33 and the edge cover 32a so as to be common to the plurality of sub-pixels P, as illustrated in FIG. 3. Further, the second electrode 34 has the function of injecting electrons into the organic EL layers 33. Further, the second electrode 34 is more desirably made of a material having a small work function, in order to improve the efficiency of electron injection into the organic EL layers 33. Here, examples of the material of the second electrode 34 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). Further, the second electrode 34 may be made of, for instance, alloy of magnesium (Mg) and copper (Cu), alloy of magnesium (Mg) and silver (Ag), alloy of sodium (Na) and potassium (K), alloy of astatine (At) and astatine oxide ($AtO_2$), alloy of lithium (Li) and aluminum (Al), alloy of lithium (Li), calcium (Ca) and aluminum (Al), or alloy of lithium fluoride (LiF), calcium (Ca) and aluminum (Al). Further, the second electrode 34 may be formed of a conductive oxide, such as tin oxide (SnO), zinc oxide (ZnO), an indium tin oxide (ITO), or an indium zinc oxide (IZO). Further, the second electrode 34 may be formed of a stack of multiple layers made of the above materials. It is noted that examples of a material having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

The sealing film 40 is provided to cover the second electrode 34 and includes a first inorganic sealing film 36, an organic sealing film 37, and a second inorganic sealing film 38 sequentially stacked on the second electrode 34, as illustrated in FIG. 3, and the sealing film 40 has the function of protecting the individual organic EL layers 33 in the organic EL element layer 35 from moisture and oxygen. Here, the first inorganic sealing film 36 and the second inorganic sealing film 38 are composed of an inorganic insulating film, such as a silicon nitride film, a silicon oxide film, or a silicon oxide nitride film. Further, the organic sealing film 37 is made of an organic resin material, such as acrylic resin, epoxy resin, silicone resin, polyurea resin, parylene resin, polyimide resin, or polyamide resin.

The organic EL display 50 also includes, in the frame region F, a first barrier wall Wa provided in the form of a frame outside the trench G, and a second barrier wall Wb provided in the form of a frame around the first barrier wall Wa, as illustrated in FIG. 1.

The first barrier wall Wa includes the following, as illustrated in FIG. 15 and FIG. 16: a lower resin layer 22b formed of the same material and in the same layer as the second flattening film 22a; and an upper resin layer 32b formed of the same material and in the same layer as the edge cover 32a. It is noted that the first barrier wall Wa is provided to overlap the perimeter of the organic sealing film 37 of the sealing film 40 and is configured to prevent the spread of ink constituting the organic sealing film 37 of the sealing film 40.

The second barrier wall Wb includes the following, as illustrated in FIG. 15 and FIG. 16: a lower resin layer 19b formed of the same material and in the same layer as the first flattening film 19a; a middle resin layer 22c formed of the same material and in the same layer as the second flattening film 22a; and an upper resin layer 32c formed of the same material and in the same layer as the edge cover 32a.

The organic EL display 50 also includes, in the frame region F, a first frame wire 18h extending widely in the form of a band in a portion where the trench G is open, extending, near the display region D, linearly toward the inside of the trench G, and having both ends opposite the display region D extending to the terminal section T, as illustrated in FIG. 1 and FIG. 16. Here, the first frame wire 18h is electrically connected to the power-source line 21a in the frame region F close to the display region D and is configured to receive high power-source voltage (ELVDD) in the terminal section T. It is noted that the first frame wire 18h and a second frame wire 18i, which will be described later on, are formed of the same material and in the same layer as the source electrodes 18a and 18c and the drain electrodes 18b and 18d.

The organic EL display 50 also includes the second frame wire 18i provided, as a third wire layer, in the form of a substantial C-shape outside the trench G in the frame region F and having both ends extending to the terminal section T, as illustrated in FIG. 1. Here, the second frame wire 18i is electrically connected to the second electrode 34 via a first conductive layer 31b formed in the trench G and is configured to receive low power-source voltage (ELVSS) in the terminal section T, as illustrated in FIG. 15. It is noted that the first conductive layer 31b is formed of the same material and in the same layer as the first electrodes 31a and is provided to overlap, in the frame region F, the second frame wire 18i and the second electrode 34 to electrically connect the second frame wire 18i and the second electrode 34 together, as illustrated in FIG. 15.

In each sub-pixel P of the organic EL display 50, a gate signal is input to the first TFT 9a via the gate line 14d to turn on the first TFT 9a, a predetermined voltage corresponding to a source signal is written into the gate electrode 14b of the second TFT 9b and the capacitor 9d via the source line 18f, thus inputting a light-emission control signal to the third TFT 9c via the light-emission control line 14e to turn on the third TFT 9c, and a current corresponding to a gate voltage of the second TFT 9b is supplied from the power-source line 21a to the organic EL layer 33, thus causing the light-emitting layer 3 of the organic EL layer 33 to emit light for image display. It is noted that in the organic EL display 50, the gate voltage of the second TFT 9b is maintained by the capacitor 9d even when the first TFT 9a is turned off, and that the light-emitting layer 3 thus keeps on emitting light in each sub-pixel P until a gate signal in the next frame is input.

Next, a method for manufacturing the organic EL display 50 according to this embodiment will be described. It is noted that the method for manufacturing the organic EL display 50 according to this embodiment includes a TFT layer forming step (thin-film transistor layer forming step), an organic-EL element layer forming step (light-emitting element layer forming step), a sealing film forming step, and a mounting step.

TFT Layer Forming Step

Forming, with a well-known method, the base coat film 11, the first TFTs 9a, the second TFTs 9b, the third TFTs 9c, the capacitors 9d, the first flattening film 19a, the third interlayer insulating film 20a, the power-source line 21a, the second flattening film 22a and other components onto the surface of the resin substrate layer 10 formed on, for instance, a glass substrate, to thus form the TFT layer 30.

Here, the following details a method of forming an electrical connection structure between the drain electrode 18d and the relay electrode 21b via the first contact hole Ha, which is formed in the first flattening film 19a, and via the second contact hole Hb, which is formed in the third interlayer insulating film 20a, in the TFT layer forming step. It is noted that FIG. 17 to FIG. 29 continuously illustrate part of the TFT layer forming step of forming the TFT layer 30 and correspond to FIG. 6.

The first process step is forming a titanium film (about 10 to 200 nm thick), an aluminum film (about 100 to 1000 nm thick), a titanium film (about 10 to 200 nm thick), and other components sequentially onto a substrate surface with the second interlayer insulating film 17 formed thereon through, for instance, sputtering to form a source metal film 18, as illustrated in FIG. 17.

The next is forming a photoresist R (about 0.5 to 3 μm thick) onto the substrate surface with the source metal film 18 thereon through, for instance, spin coating, as illustrated in FIG. 18.

Furthermore, the photoresist R undergoes irradiation of ultraviolet light U from a light source L through a photo mask Ma to be thus exposed, followed by development and baking to form a resist pattern Ra, as illustrated in FIG. 19.

The next is removing the source metal film 18 exposed from the resist pattern Ra through, for instance, dry etching to form the drain electrode 18d, as illustrated in FIG. 20.

The next is removing the resist pattern Ra, followed by applying photosensitive polyimide resin onto the substrate surface with the drain electrode 18d formed thereon through, for instance, spin coating to form a photosensitive resin layer 19, as illustrated in FIG. 21. It is noted that although this embodiment has described a method of applying photosensitive polyimide resin by way of example, other photosensitive resins, including photosensitive acrylic resin, photosensitive phenol resin, and photosensitive novolak resin, may be applied.

Furthermore, the photosensitive resin layer 19 undergoes photolithography. That is, the photosensitive resin layer 19 undergoes irradiation of ultraviolet light U from the light source L through a photo mask Mb to be exposed, as illustrated in FIG. 22, followed by development and baking, thereby forming the first contact hole Ha so as to expose part of the drain electrode 18d, as illustrated in FIG. 23, to thus form the first flattening film 19a (flattening film forming step).

The next is forming a silicon oxide nitride film (about 10 500 nm thick) onto the substrate surface with the first flattening film 19a thereon through, for instance, plasma chemical vapor deposition (CVD) to thus form the inorganic insulating film 20, as illustrated in FIG. 24.

The next is forming a photoresist R (about 0.5 to 3 μm thick) onto the substrate surface with the inorganic insulating film 20 thereon through, for instance, spin coating, as illustrated in FIG. 25.

Furthermore, the photoresist R undergoes photolithography. That is, the photoresist R undergoes irradiation of ultraviolet light U from the light source L through a photo mask Mc to be thus exposed, as illustrated in FIG. 26, followed by development and baking to form a resist pattern Rb, as illustrated in FIG. 27.

The next is removing the inorganic insulating film 20 exposed from the resist pattern Rb through, for instance, dry etching to form, as illustrated in FIG. 28, the second contact hole Hb so as to expose part of the edge of the first flattening film 19a, thus forming the third interlayer insulating film 20a (interlayer insulating film forming step).

The next is removing the resist pattern Rb, as illustrated in FIG. 29, followed by forming a titanium film (about 10 to 200 nm thick), an aluminum film (about 100 to 1000 nm thick), a titanium film (about 10 to 200 nm thick), and other components sequentially onto the substrate surface with the third interlayer insulating film 20*a* formed thereon through, for instance, sputtering, followed by patterning a stack of these metal films to form, as illustrated in FIG. 6, the relay electrode 21*b*.

Through the foregoing, the electrical connection structure between the drain electrode 18*d* and the relay electrode 21*b* can be formed in the TFT layer 30.

Organic-EL Element Layer Forming Step

The organic EL element layer 35 is formed by forming, through a well-known method, the first electrodes 31*a*, the edge cover 32*a*, the organic EL layers 33 (the hole injection layers 1, the hole transport layers 2, the light-emitting layers 3, the electron transport layers 4, and the electron injection layers 5), and the second electrode 34 onto the second flattening film 22*a* of the TFT layer 30 as formed in the TFT layer forming step.

Sealing Film Forming Step

Firstly, the first inorganic sealing film 36 is formed by forming, through plasma CVD using a mask, an inorganic insulating film, such as a silicon nitride film, a silicon oxide film, or a silicon oxide nitride film, onto the substrate surface provided with the organic EL element layer 35 as formed in the organic-EL element layer forming step.

Then, the organic sealing film 37 is formed by forming, through an ink-jet method for instance, a film of an organic resin material, such as acrylic resin, onto the substrate surface with the first inorganic sealing film 36 thereon.

Thereafter, through plasma CVD using a mask, an inorganic insulating film, such as a silicon nitride film, a silicon oxide film, or a silicon oxide nitride film, is formed onto the substrate with the organic sealing film 37 thereon, to form the second inorganic sealing film 38, thus forming the sealing film 40.

The final process step is attaching a protective sheet (not shown) onto the substrate surface with the sealing film 40 thereon, followed by laser light irradiation from the glass substrate of the resin substrate layer 10 to detach the glass substrate from the lower surface of the resin substrate layer 10, followed by further attaching a protective sheet (not shown) to the lower surface of the resin substrate layer 10 with the glass substrate detached therefrom.

The organic EL display 50 according to this embodiment can be manufactured through the foregoing process steps.

As described above, in the organic EL display 50 and the method for manufacturing the same according to this embodiment, a portion along one side at the edge of the first flattening film 19*a* provided with the first contact hole Ha having a rectangular shape in a plan view is exposed from the edge of the third interlayer insulating film 20*a* provided with the second contact hole Hb having a rectangular shape in a plan view. Accordingly, the portion along this one side at the edge of the first flattening film 19*a* provided with the first contact hole Ha is not covered by the third interlayer insulating film 20*a*, which has a gas barrier property, thus enabling unnecessary substances contained in the first flattening film 19*a*, such as moisture and degasifying elements, to be discharged from this one side at the edge of the first flattening film 19*a*, thereby preventing the relay electrode 21*b* from film coming-off or film peel. Further, a portion along the other three sides at the edge of the first flattening film 19*a* provided with the first contact hole Ha is covered by the third interlayer insulating film 20*a*; accordingly, this can prevent the other three sides at the edge of the first flattening film 19*a* from a break that is caused by alternation (e.g., oxidation), insufficient film thickness or a level difference in the relay electrode 21*b*. This can prevent a break that is caused by film coming-off, film peel, alternation (e.g., oxidation), insufficient film thickness or a level difference in the relay electrode 21*b* formed in the first contact hole Ha and second contact hole Hb, thereby preventing the first contact hole Ha and second contact hole Hb from faulty electrical continuity.

Further, in the organic EL display 50 and the method for manufacturing the same according to this embodiment, the third interlayer insulating film 20*a*, which is composed of an inorganic insulating film, is provided on the first flattening film 19*a*, which is composed of an organic insulating film; accordingly, this can improve the adhesion between the power-source line 21*a* and relay electrode 21*b* provided on the third interlayer insulating film 20*a*. Further, the first flattening film 19*a* is covered by the third interlayer insulating film 20*a* when the power-source line 21*a* and the relay electrode 21*b* are formed through dry etching, and hence, the first flattening film 19*a*, composed of an organic insulating film, is prevented from surface etching; accordingly, this can prevent a dry etching apparatus from contamination within its chamber.

OTHER EMBODIMENTS

Although the first embodiment has described, by way of example, an electrical connection structure between the drain electrode 18*d*, which is provided as a lower wire, and the relay electrode 21*b*, which is provided as an upper wire, the disclosure is also applicable to an electrical connection structure between other wire layers.

Further, although the first embodiment has described, by way of example, an organic EL layer having a five-ply stacked structure of a hole injection layer, a hole transport layer, a light-emitting layer, an electron transport layer, and an electron injection layer, the organic EL layer may have a three-ply structure of, for instance, a hole injection and transport layer, a light-emitting layer, and an electron transport and injection layer.

Further, although the first embodiment has described, by way of example, an organic EL display having a first electrode that is an anode, and a second electrode that is a cathode, the disclosure is also applicable to an organic EL display with the stacked structure of its organic EL layer being inverted: a first electrode as a cathode, and a second electrode as an anode.

Further, although the first embodiment has described, by way of example, an organic EL display having a drain electrode that is a TFT electrode connected to a first electrode, the disclosure is also applicable to an organic EL display having a source electrode that is a TFT electrode connected to a first electrode.

Further, although the first embodiment has described an organic EL display as a display device by way of example, the disclosure is applicable to a display device including a plurality of light-emitting elements that are driven by current. For instance, the present invention is applicable to a display device including quantum-dot light-emitting diodes (QLEDs), which are light-emitting elements included in a layer containing quantum dots.

INDUSTRIAL APPLICABILITY

As described above, the disclosure is useful for flexible display devices.

The invention claimed is:

1. A display device comprising:
   a base substrate;
   a thin-film transistor layer provided on the base substrate and having a stack of, in sequence from the base substrate, a lower wire, a flattening film composed of an organic insulating film, an interlayer insulating film composed of an inorganic insulating film, and an upper wire; and
   a light-emitting element layer provided on the thin-film transistor layer and including a plurality of first electrodes, a plurality of light-emitting layers, and a common second electrode stacked sequentially in correspondence with a plurality of sub-pixels to form a display region,
   wherein:
      the flattening film has a first contact hole formed to pass through the flattening film and formed for electrically connecting the lower wire and the upper wire together,
      the interlayer insulating film has a second contact hole formed to pass through the interlayer insulating film and formed for electrically connecting the lower wire and the upper wire together,
      a part of a side surface of the flattening film provided with the first contact hole is exposed from an edge of the interlayer insulating film provided with the second contact hole, and
      another part of the side surface of the flattening film provided with the first contact hole is covered with the edge of the interlayer insulating film provided with the second contact hole.

2. The display device according to claim 1, wherein
   the first contact hole and the second contact hole are formed individually in a rectangular shape in a plan view,
   the part of the side surface of the flattening film includes a portion along at least one side of the second contact hole formed in the rectangular shape, and
   the portion is exposed from the edge of the interlayer insulating film.

3. The display device according to claim 2, wherein the portion along four sides of the second contact hole formed in the rectangular shape is exposed continuously from the edge of the interlayer insulating film.

4. The display device according to claim 2, wherein the portion along one side of the second contact hole formed in the rectangular shape is exposed from the edge of the interlayer insulating film.

5. The display device according to claim 2, wherein the portion along two sides, facing each other, of the second contact hole formed in the rectangular shape is exposed from the edge of the interlayer insulating film.

6. The display device according to claim 2, wherein the portion along two sides, adjacent to each other, of the second contact hole formed in the rectangular shape is exposed continuously from the edge of the interlayer insulating film.

7. The display device according to claim 1, wherein the second contact hole is formed in a rectangular shape in a plan view, and
   the part of the side surface of the flattening film is exposed from at least one corner at the edge of the interlayer insulating film.

8. The display device according to claim 1, wherein the side surface of the flattening film has a first protrusion protruding inward in a plan view,
   the edge of the interlayer insulating film has a second protrusion protruding inward in the plan view and provided to overlap the first protrusion,
   the part of the side surface of the flattening film includes a part of the first protrusion, and
   the part of the first protrusion is exposed from the second protrusion.

9. The display device according to claim 1, wherein the thin-film transistor layer includes a plurality of thin-film transistors,
   the lower wire is a drain electrode of a corresponding one of the plurality of thin-film transistors, and
   the upper wire is a relay electrode for electrically connecting a corresponding one of the plurality of first electrodes and the drain electrode together.

10. The display device according to claim 1, further comprising:
    a sealing film provided on the light-emitting element layer and having a stack of, in sequence from the light-emitting element layer, a first inorganic sealing film, an organic sealing film, and a second inorganic sealing film.

11. The display device according to claim 1, wherein the flattening film is formed of a polyimide resin, an acrylic resin, or a novolak resin.

12. The display device according to claim 1, wherein the interlayer insulating film is formed of at least one of a silicon nitride film, a silicon oxide film, a silicon oxide nitride film, and an aluminum oxide film.

13. The display device according to claim 12, wherein the interlayer insulating film has a gas barrier property.

14. The display device according to claim 1, wherein the plurality of light-emitting layers is organic electroluminescence layers.

15. A method for manufacturing a display device, the method comprising:
    forming, onto a base substrate, a thin-film transistor layer having a stack of, in sequence from the base substrate, a lower wire, a flattening film composed of an organic insulating film, an interlayer insulating film composed of an inorganic insulating film, and an upper wire; and
    forming, onto the thin-film transistor layer, a light-emitting element layer including a plurality of first electrodes, a plurality of light-emitting layers, and a common second electrode stacked sequentially in correspondence with a plurality of sub-pixels to form a display region,
    wherein forming the thin-film transistor layer includes:
       forming the lower wire,
       forming the flattening film, onto the lower wire, having a first contact hole,
       forming the interlayer insulating film, onto the flattening film, having a second contact hole, and
       forming the upper wire, onto the interlayer insulating film, electrically connected to the lower wire through the first contact hole and the second contact hole, and
    wherein forming the interlayer insulating film includes:
       forming the second contact hole so as to expose a part of a side surface of the flattening film provided with the first contact hole, and
       covering another part of the side surface of the flattening film with the interlayer insulating film.

16. The method according to claim 15, wherein forming the flattening film includes:
    applying a photosensitive resin to form a photosensitive resin layer, and patterning the photosensitive resin layer through photolithography to form the first contact hole.

17. The method according to claim 15, wherein forming the interlayer insulating film further includes
patterning the inorganic insulating film through photolithography and dry etching to form the second contact hole.

18. The method according to claim 15, further comprising:
forming, onto the light-emitting element layer, a sealing film having a stack of, in sequence from the light-emitting element layer, a first inorganic sealing film, an organic sealing film, and a second inorganic sealing film.

19. The method according to claim 15, wherein the plurality of light-emitting layers is organic electroluminescence layers.

* * * * *